US00RE34808E

United States Patent [19]

Hsieh

[11] E

[45] Reissued

Patent Number: Re. 34,808

Date of Patent: Dec. 20, 1994

[54] TTL/CMOS COMPATIBLE INPUT BUFFER WITH SCHMITT TRIGGER

[75] Inventor: Hung-Cheng Hsieh, Sunnyvale, Calif.

[73] Assignee: Xilinx, Inc., San Jose, Calif.

[21] Appl. No.: 610,603

[22] Filed: Nov. 8, 1990

Related U.S. Patent Documents

Reissue of:

[64] Patent No.: 4,783,607
Issued: Nov. 8, 1988
Appl. No.: 927,289
Filed: Nov. 5, 1986

[51] Int. Cl.[5] ..... H03K 19/094; H03K 19/0175; H03K 3/356

[52] U.S. Cl. ..... 326/71; 327/206

[58] Field of Search ..... 307/290, 475, 296.1, 307/296.6, 296.7, 296.8

[56] References Cited

U.S. PATENT DOCUMENTS

| | | | |
|---|---|---|---|
| 4,032,795 | 6/1977 | Hale . | |
| 4,258,272 | 3/1981 | Huang . | |
| 4,430,582 | 2/1984 | Bose et al. | 307/475 |
| 4,438,352 | 3/1984 | Mardkha . | |
| 4,469,959 | 9/1984 | Luke et al. . | |
| 4,471,242 | 9/1984 | Noufer et al. . | |
| 4,472,647 | 9/1984 | Allgood et al. . | |
| 4,475,050 | 10/1984 | Noufer . | |
| 4,490,633 | 12/1984 | Noufer et al. . | |
| 4,504,747 | 3/1985 | Smith et al. . | |
| 4,563,595 | 1/1986 | Bose | 307/475 |
| 4,584,492 | 4/1986 | Sharp | 307/475 |
| 4,587,447 | 5/1986 | Baehring | 307/475 |
| 4,612,461 | 9/1986 | Sood . | |
| 4,820,937 | 4/1989 | Hsieh | 307/475 |

FOREIGN PATENT DOCUMENTS

| | | |
|---|---|---|
| 0154337 | of 0000 | European Pat. Off. . |
| 2708021 | of 0000 | Germany . |
| 227843A1 | 9/1985 | Germany . |
| 2130833A | 6/1984 | United Kingdom . |

OTHER PUBLICATIONS

Branko Dokic, "Modified CMOS Inverters", 2218 Microelectronics Journal, vol. 14 (1983) Jul.-Aug., No. 4, Kirkcaldy, Great Britain, pp. 39–44.

Paul R. Gray and Robert G. Meyers, "Analysis and Design of Analog Integrated Circuits" pp. 741–749, 762, John Wiley & Sons (2nd Ed.) 1984.

B. L. Dokic, "CMOS Schmitt Triggers", IEE Proceedings, vol. 131, Part G, No. 5, Oct. 1984, pp. 197–202, IEE, Old Woking, Surrey, Great Britain.

*Primary Examiner*—John Zazworsky

*Attorney, Agent, or Firm*—Edel M. Young; Keeneth E. Leeds

[57] ABSTRACT

A TTL/CMOS compatible input buffer circuit comprises a Schmitt trigger input buffer stage and a reference voltage generator. In the TTL mode, the reference voltage generator supplies a reference voltage having a level that forces the trigger point of the Schmitt trigger to a predetermined value. In the CMOS mode, the reference voltage generator is disabled and a voltage equal to the power supply voltage is provided to the Schmitt trigger. The input buffer circuit affords an enhanced input noise margin and minimizes DC power loss.

7 Claims, 2 Drawing Sheets

TIME
(* + = $ 0)
V (2)
1.0000D+00
1.000D+00
3.000D+00
5.000D+00
7.000D+00
.0000D+00 3.000D+00
1.0000D-06 3.000D+00
2.0000D-06 3.000D+00
3.0000D-06 3.000D+00
4.0000D-06 3.000D+00
5.0000D-06 3.000D+00
6.0000D-06 3.114D+00
7.0000D-06 3.207D+00
8.0000D-06 3.264D+00
9.0000D-06 3.300D+00
1.0000D-05 3.264D+00
1.1000D-05 3.205D+00
1.2000D-05 3.112D+00
1.3000D-05 3.000D+00
1.4000D-05 2.889D+00
1.5000D-05 2.795D+00
1.6000D-05 2.736D+00
1.7000D-05 2.700D+00
1.8000D-05 2.735D+00
1.9000D-05 2.794D+00
2.0000D-05 2.887D+00
2.1000D-05 2.999D+00
2.2000D-05 3.110D+00
2.3000D-05 3.202D+00
2.4000D-05 3.239D+00
2.5000D-05 3.239D+00
2.6000D-05 1.814D-01
2.7000D-05 1.068D-01
2.8000D-05 4.714D-02
2.9000D-05 1.790D-02
3.0000D-05 5.652D-04
3.1000D-05 2.222D-04
3.2000D-05 3.585D-05
3.3000D-05 -4.407D-05
3.4000D-05 1.656D-05
3.5000D-05 3.313D-05
3.6000D-05 -1.876D-05
3.7000D-05 2.713D-05
3.8000D-05 8.881D-05
3.9000D-05 1.117D-04
4.0000D-05 2.045D-04
4.1000D-05 4.886D-04
4.2000D-05 6.164D-04
4.3000D-05 4.895D-04
4.4000D-05 2.133D-04
4.5000D-05 9.922D-05
4.6000D-05 2.407D-05
4.7000D-05 7.310D-06
4.8000D-05 4.020D-06
4.9000D-05 1.053D-05
5.0000D-05 4.274D-05
5.1000D-05 7.167D-04
5.2000D-05 1.818D-03
5.3000D-05 3.613D-02
5.4000D-05 9.171D-02
5.5000D-05 1.789D-01
5.6000D-05 2.933D-01
5.7000D-05 4.147D-01
5.8000D-05 5.370D-01
5.9000D-05 5.611D-01
6.0000D-05 5.198D-01
6.1000D-05 3.969D-01
6.2000D-05 3.050D-01
6.3000D-05 2.517D-01
6.4000D-05 2.995D-01
6.5000D-05 6.558D-01
6.6000D-05 3.145D+00
6.7000D-05 3.793D+00
6.8000D-05 3.888D+00
6.9000D-05 3.999D+00
7.0000D-05 3.114D+00
7.1000D-05 3.204D+00
7.2000D-05 3.264D+00
7.3000D-05 3.300D+00
7.4000D-05 3.264D+00
7.5000D-05 3.235D+00
7.6000D-05 3.112D+00
7.7000D-05 3.000D+00
7.8000D-05 3.887D+00
7.9000D-05 3.796D-00
8.0000D-03 3.721D+00
$V_{in}$
$V_{ref}$
$V_{out}$

TTL/CMOS COMPATIBLE INPUT BUFFER WITH SCHMITT TRIGGER

Matter enclosed in heavy brackets [ ] appears in the original patent but forms no part of this reissue specification; matter printed in italics indicates the additions made by reissue.

CROSS-REFERENCE TO COPENDING PATENT APPLICATION

Copending U.S. patent application Ser. No. 788,344, filed Sept. 19, 1985 on behalf of H. C. Hsieh and assigned to the same assignee, *now U.S. Pat. No. 4,820,937, incorporated herein by reference,* discloses a TTL/CMOS input buffer incorporating an input inverter in the CMOS input buffer. The trigger point of the input inverter is established at a selected level in response to a reference voltage provided by a voltage generator. The circuit realizes a [reduce] *reduced* sensitivity to variations in power supply noise and maximizes input noise margins. The input buffer has high speed, low or no DC power dissipation at TTL input levels, and no DC power dissipation at CMOS input levels.

BACKGROUND OF THE INVENTION

1. Field of The Invention

This invention relates to a TTL/CMOS compatible input buffer incorporating a Schmitt trigger.

2. Description of The Prior Art

Conventional bipolar integrated circuits operate at low voltage logic levels. Typically, a low or logical "0" for TTL logic circuits ranges from 0.0 to 0.8 volts and a high or logical "1" ranges from 2.0 to 5.0 volts. Thus in order to distinguish between a logical 0 and a logical 1 a CMOS inverter must be capable of switching somewhere between 0.8 and 2.0 volts and preferably at approximately 1.4 volts in order to provide the widest possible noise margin. A CMOS inverter generally operates at voltages of 4.5 to 15 volts with 5 volts being typical. If the source of the P-channel transistor in the CMOS inverter is connected to a voltage of 5 volts, for example, the P-channel transistor will draw a steady state current when a TTL logical "1" as low as 2.0 volts is applied to its gate. Hence it is desirable to establish the switching or trigger point of the CMOS input inverter in a TTL/CMOS buffer at approximately 1.4 volts to maximize noise margins, and to provide a voltage of less than 5 volts on the sources of P-channel transistors in the input buffer in order to reduce steady state power consumption.

To overcome the problem of the differences in operating voltages of the TTL logic circuits and the CMOS circuits, various solutions have been proposed. For example, U.S. Pat. No. 4,471,242 issued Sept. 11, 1984 to Noufer, et al., which is incorporated herein by reference, describes a TTL/CMOS input buffer that accomplished buffering a TTL signal to a CMOS signal with low current flow through a CMOS input inverter in a static (nonswitching) condition. This is achieved by providing a selected reference voltage to the source of the P-channel transistor in the CMOS input inverter. The reference voltage is selected to be less than the lowest voltage level of the TTL logical "1" (2.0 volts) minus the threshold voltage of the P-channel transistor.

Similarly, U.S. Pat. No. 4,475,050 issued to Noufer on Oct. 2, 1984, which is incorporated herein by reference, prevents current flow through the CMOS inverter of the TTL to CMOS input buffer by providing a reference voltage to the source of the P-channel transistor in the input inverter which is responsive to the voltage level of the TTL input signal.

U.S. Pat. No. 4,469,959, issued to Luke et al. on Sept. 4, 1984, which is incorporated herein by reference, describes a bypass means that compensates for the body effect of the load transistor to maintain the switch point of the input inverter stage at a relatively constant value.

When a relatively large number of input buffers are provided in a circuit network, for example as many as 60, if all the inputs are switched simultaneously, the trigger points of the inverters, such as used with the circuit disclosed in the copending patent application, would vary as the reference voltage supplied to the input inverters varies. The greater the number of input buffers that are connected and switched simultaneously, the greater the potential peak-to-peak noise. Simultaneous switching causes a drain on the current source resulting in wiggle of the reference voltage. If the transistion time of an input inverter is slow, such that it intersects with the waveform of the trigger point of the input inverter more than once, the input would be interpreted as having logical level 1010, so that multiple transitions could appear at the output of the input buffer. It would be desirable to reduce the sensitivity to transients and peak-to-peak noise when switching the input stages of the input buffer circuits.

SUMMARY OF THE INVENTION

According to this invention, a TTL/CMOS compatible input buffer incorporates a Schmitt trigger in order to reduce sensitivity of the input buffer to noise on the reference voltage and to provide improved tolerance for slow input transitions. The operation of the Schmitt trigger is characterized by hysteresis so that the trigger point is lower when its input voltage is falling than when the input voltage is rising, and the difference in the voltage levels of the trigger points provides improved tolerance to noise and enhances noise immunity. Also, in the circuit of this invention, noise associated with the reference voltage is damped by a large capacitor, and a large transistor provides a true voltage source to limit excursions of the voltage waveform.

BRIEF DESCRIPTION OF THE DRAWING

The invention will be described in detail with reference to the drawing in which.

DETAILED DESCRIPTION OF THE PREFERRED EMBODIMENT

Figure 1:
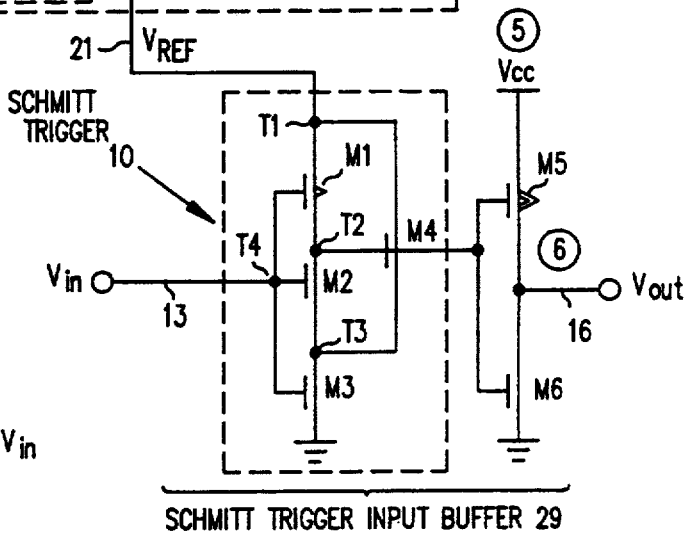
FIG. 1 is a schematic block diagram of the novel circuit of this invention.
Figure 1:
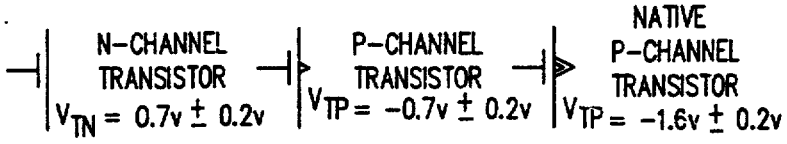

With reference to FIG. 1, a TTL/CMOS compatible input buffer comprises a Schmitt trigger 10 and a reference voltage generator 20. The reference voltage generator 20 provides a reference voltage to establish the trigger point of the Schmitt trigger to be at the desired level of approximately 1.4 volts. The Schmitt trigger 10 has a hysteresis characteristic that effectively enhances noise immunity, and is used in the input buffer circuit of this invention to replace the inverter circuit incorporated in the input buffer disclosed in the aforementioned copending patent application.

With reference to FIG. 1, the Schmitt trigger includes a P-channel enhancement transistor M1 and N-channel enhancement transistors M2, M3 and M4. The gate electrodes of transistors M1, M2 and M3 are connected to receive an input signal $V_{IN}$ through lead 13, and the drains of transistors M1 and M2 are connected to the gate of transistor M4 to couple to an output terminal $V_{OUT}$ through lead 16. The source of transistor M1 is connected to the drain of transistor M4 to couple to the reference voltage generator 20 through a lead 21. The drain of transistor M3 is connected to the sources of transistors M2 and M4. The source of transistor M3 is connected to a reference potential or ground.

When the input buffer operates in the TTL mode, i.e., when the signals on input lead $V_{IN}$ of the input buffer are at TTL levels switching between 0.8 volts and 2.0 volts, one desirable voltage level of reference voltage $V_{REF}$ on output lead 21 is approximately 3.5 volts. Thus the DC power loss of the input buffer is substantially reduced from the DC power loss that would result if the reference voltage $V_{REF}$ were at $V_{cc}$, which is typically 5 volts. The DC power loss is the power loss resulting from the steady state current that flows from the reference generator 20 through transistors M1, M2 and M3 to ground.

When the Schmitt trigger 10 is in the steady or nonswitching state, it is desirable that the trigger of trip point, which is a function of $V_{REF}$, should be at or near the midpoint of the TTL voltage levels, which is approximately 1.4 volts. The Schmitt trigger operates at two trigger voltage levels, one trigger occurring at the rising edge of the input signal and the second trigger occurring at the falling edge of the input signal. In accordance with this invention, a larger noise margin is obtained by virtue of the two distinct trigger voltages which are centered about the desired 1.4 volt level.

When operating the input buffer with the Schmitt trigger, as illustrated in FIG. 1, when the input node or terminal T4 is at 0 volts, then mode T2 is charged to the reference voltage $V_{REF}$ and node T3 is charged to $V_{REF}-V_t(M4)$, where $V_t(M4)$ is the threshold voltage of M4, an N-channel enhancement transistor. As the input signal begins to rise, the voltage at node T3 starts to fall. The DC characteristic is determined by transistors M3 and M4, while transistor M2 is off. As the input rises to a voltage level that is $V_t(M2)$ above the voltage at node T3, transistor M2 turns on and the voltage at node T2 falls quickly so that transistor M4 cuts off.

For the falling edge of the input signal, initially both voltages at node T2 and node T3 are 0 volts and transistor M4 is nonconducting or off. As the input $V_{IN}$ applied to node T4 falls, the voltages at node T2 and at node T3 both rise. When the voltage difference between the input $V_{IN}$ and that at terminal T3 is less than the voltage $V_t$ (M2), transistor M2 cuts off and the voltage at terminal T2 rises rapidly to the reference voltage $V_{REF}$ and transistor M4 is turned [off] *on*. The DC characteristic of the Schmitt trigger is then determined by transistors M3 and M4 that provide a higher trigger point than the inverter comprising transistors M1, M2 and M3.

In operation of the input buffer, a power down (PD) control signal is applied to transistor P4 of the reference voltage generator 20. P4 is coupled to a voltage supply $V_{cc}$ and to ground potential through series resistors R1 and R2. Resistor R1 has a resistance value greater than that of R2, in this implementation, being in the ratio of 5R:2R, by way of example. The resistance values are selected so that the reference voltage at node T1A is at the midpoint of the range of TTL values, [taht] *that* is at 1.4 Volts approximately. When transistor P4 is on, the reference voltage on node T1A is substantially equal to the desired trigger point of the Schmitt trigger 10, which is the selected value between the low level TTL signal (0.8 volts) and the high level TTL signal (2.0 Volts).

The voltage at node T1A is applied to the inverting input lead 26 of operational amplifier 25. Capacitor C1 which is connected between T1A and ground smooths any glitches that may be caused by power supply perturbations. The noninverting input lead 27 of the op amp 25 is connected to the [ouptut] *output* node T2A of the reference input buffer stage 11A of the reference voltage generator. The reference input buffer stage 11A comprises a P-channel transistor P2, an N-channel transistor N2, an N-channel transistor N3, and an N-channel transistor N4. The configuration of the reference input buffer stage 11A is substantially equivalent to that of the Schmitt trigger 10, except that the node T2A is shorted to the gates of P2, N2 and N3. The ratios of the sizes of the transistors P2, N2, N3 and N4 are substantially the same as the ratios of sizes of transistors M1, M2, M3 and M4, respectively. The output signal of the operational amplifier 25 controls the gate of a P-channel transistor P3, which is a relatively large transistor. The transistor P3 acts as a true voltage source and limits excursions of the voltage at node T3A. P3 supplies transient current for all input buffers in the system, which are similar to the Schmitt trigger input buffer 29, and is connected to the output lead 21 of the reference voltage generator 20. A capacitor C2, which is a large capacitor having a capacitance value of 50 picoFarads, by way of example, is connected to output lead 21 of the reference voltage generator 20 and serves to stabilize the reference voltage.

The Schmitt trigger input buffer 29 includes an output stage comprising an inverter formed with a P-channel transistor [MR] *M5* and N-channel transistor M6. The transistor M5 is a native P-channel transistor having a threshold voltage of about $-1.6$ Volts$\pm 0.2$ Volts, so that the inverter formed by the M5 and M6 transistors does not consume DC power when $V_{REF}$ has a value greater than or equal to 3.5 volts approximately.

Since the voltage on the gates of transistors P2, N2 and N3 is the same as the voltage on node T2A connected to the drains of transistors P2 and N2, the trigger point of the reference input buffer is in effect the voltage at node T2A, which is connected to the noninverting lead 27 at the input of op amp 25. The output signal from the op amp 25 is fed to the gate of P3 to establish a reference voltage at node T3A so that the voltage at the node T2A approaches the desired level of about 1.4 volts.

Since the ratios of the sizes of the transistors of the Schmitt trigger 10 are the same as the ratios of the sizes of the transistors of the reference input buffer stage 11A, and since the node T3A is connected to node T1 of the Schmitt trigger, the trigger point of the Schmitt trigger is the same as the trigger point of the reference input buffer, which is at the desired approximate 1.4 volt level.

Figure 2:
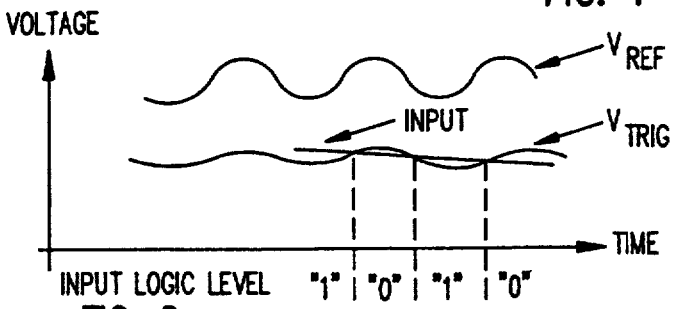
FIG. 2 includes waveforms depicting an indeterminate output caused by noisy reference voltage and a slow input transition.

FIG. 2 illustrates two waveforms, representing the reference voltage $V_{REF}$, and the trigger voltage $V_{TRIG}$ with slow input transistions and a noisy reference voltage that produces a indeterminate output signal. A feature of the invention is that the Schmitt trigger input buffer with its hysteresis characteristic overcomes the effect of the slow input transistions. The hysteresis of the Schmitt trigger, which is controlled by the transistor sizes, causes a change in the threshold level of the trigger. The Schmitt trigger is characterized by two trigger points which are higher and lower than the desired 1.4 volt trigger level respectively. The trigger points are switched in response to the rising and falling edges of the input signal $V_{IN}$. By virtue of the hysteresis of the Schmitt trigger, a significant improvement is realized in noise immunity for noise on the reference voltage and for noise on the input signal.

Figure 3A:
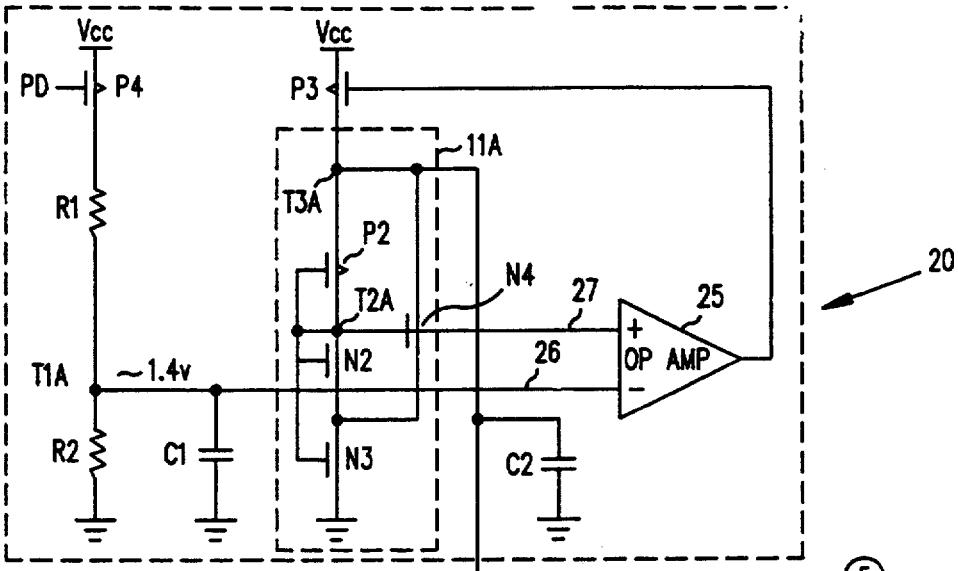
FIGS. 3a and 3b represent respectively the transfer curves of a normal inverter and a Schmitt trigger.
Figure 3A:
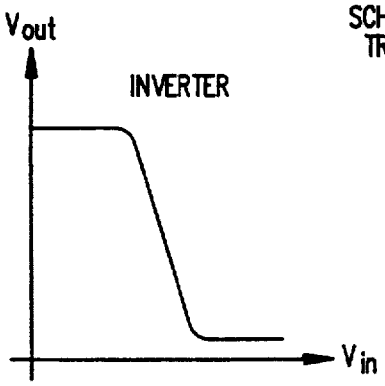
Figure 3B:
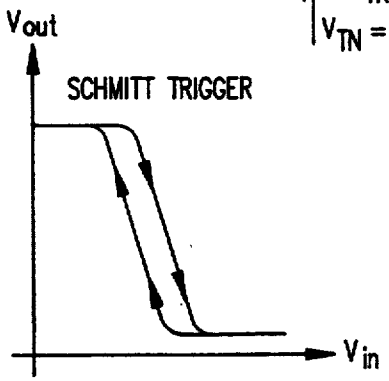

FIGS. 3a and 3b show the transfer curves for a normal inverter and a Schmitt trigger respectively, illustrating the hysteresis characteristic of the Schmitt trigger.

Figure 4:
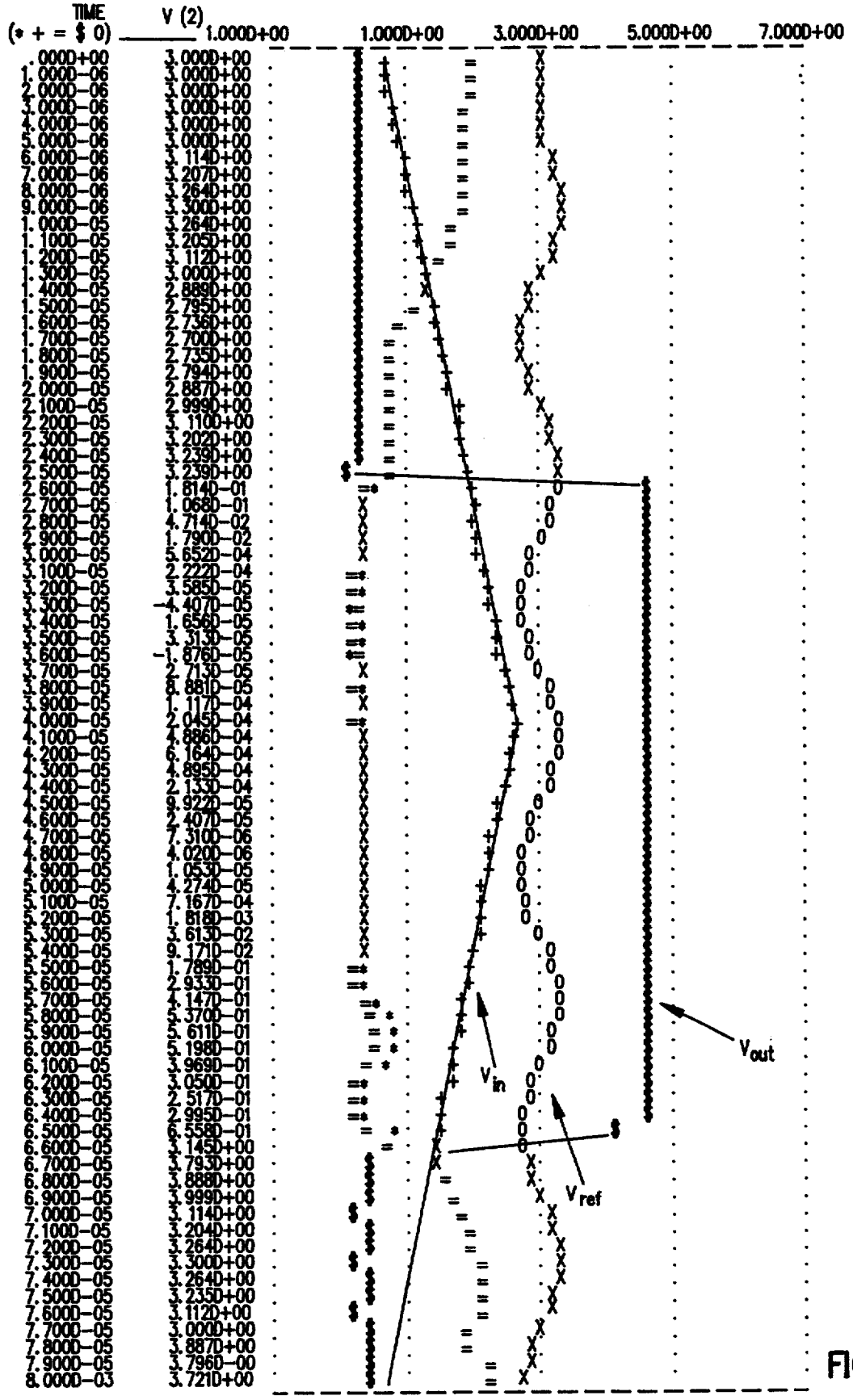
FIG. 4 is a computer simulation of the TTL/CMOS input buffer of this invention when operating with a Schmitt trigger in a noisy reference voltage environment.

FIG. 4 represents a computer simulation obtained by simulating the operation of the Schmitt trigger input buffer in a noisy reference voltage environment. The input buffer of this invention affords better noise immunity and improves the tolerance to the noise level of the reference voltage, thereby increasing the reliability of the input buffer even when the input signal has a very slow transition time.

What is claimed is:

1. A TTL/CMOS compatible input buffer network comprising:

a reference voltage generator for providing a reference voltage at a coupling electrical lead;

a Schmitt trigger input buffer coupled to said electrical lead;

said reference voltage generator comprising a reference input buffer stage having a first P-channel enhancement transistor, and first, second and third N-channel enhancement transistors;

an operational amplifier having a noninverting input terminal, an inverting input terminal, and an output lead;

a large P-channel enhancement transistor having gate, source and drain electrodes, the gate electrode of said large P-channel transistor being coupled to the output lead of said operational amplifier, and the drain electrode of said large P-channel transistor being coupled to said coupling electrical lead and to said P-channel transistor of said reference input buffer stage;

said operational amplifier, large P-channel transistor, and first P-channel transistor forming a negative feedback loop;

means for applying a fixed reference voltage to said inverting terminal of said operational amplifier;

means for connecting said noninverting terminal of said operational amplifier to the gate electrodes of said transistors of said reference input buffer stage;

said Schmitt trigger input buffer comprising a Schmitt trigger having a first P-channel enhancement transistor and first, second and third N-channel enhancement transistors; and an output stage having a native P-channel enhancement transistor and a fourth N-channel enhancement transistor, the gates of said native P-channel transistor and fourth N-channel transistor being connected to a node between said first P-channel enhancement transistor and said first N-channel enhancement transistor of said Schmitt trigger.

2. A TTL/CMOS compatible input buffer network as in claim 1, wherein the configuration, ratios and electrical characteristics of said P-channel and N-channel transistors of said Schmitt trigger are matched and substantially equivalent to the configuration, ratios and electrical characteristics of said P-channel and N-channel transistors respectively of said reference input buffer stage; and wherein said reference input buffer stage includes an electrical shorting connection for connecting a node between said first P-channel and said first N-channel enhancement transistors to the gate electrodes of said first P-channel and said first, second and third N-channel enhancement transistors.

3. A TTL/CMOS compatible input buffer network as in claim 1 [including] *in which said means for applying a fixed reference voltage to said inverting terminal of said operational amplifier comprises;* first and second resistors connected in series and to a voltage source; and means for connecting said inverting input terminal of said operational amplifier to a node between said resistors.

4. A TTL/CMOS compatible input buffer network as in claim 1 including a large capacitor connected to said coupling electrical lead for damping noise on said reference voltage.

*5. A TTL/CMOS compatible input buffer network comprising:*

*a Schmitt trigger circuit having a higher trigger point to rising input signals and a lower trigger point to falling input signals, and having an input line for receiving an input signal, an output line for providing an output signal, a ground terminal for being connected to a ground voltage, and a reference voltage lead which receives a reference voltage, said Schmitt trigger circuit comprising a plurality of transistors connected to form a Schmitt trigger;*

*a reference stage having transistors corresponding to each of said transistors of said Schmitt trigger circuit and having input and output lines, a ground terminal, and a reference voltage lead corresponding to those of said Schmitt trigger circuit, said transistors of said reference stage having length to width ratios substantially the same as corresponding transistors of said Schmitt trigger circuit, said transistors of said reference stage being connected to each other as in said Schmitt trigger circuit, and additionally said input and output lines of said reference stage being shorted together to supply a reference stage output voltage which is between said trigger points of said Schmitt trigger circuit; and*

*a reference voltage establishing circuit which receives a selected voltage and said reference stage output voltage, and generates said reference voltage such that said reference voltage such that said reference stage output voltage is equal to said selected voltage.*

*6. A TTL/CMOS compatible input buffer network as in claim 5 in which said reference voltage establishing circuit comprises:*

*a large transistor, large enough to supply transient current for all input buffers in a system, said large transistor having a first current carrying terminal connected to a supply voltage and a second current carry-*

*ing terminal for supplying said reference voltage, and*

*a control terminal; and*

*an operational amplifier which:*

*in a TTL mode receives said selected voltage and said reference stage output voltage and provides an output signal to said control terminal of said large transistor, which generates said reference voltage, and*

*in a CMOS mode is disabled, whereby said large transistor is fully on and provides said supply voltage as said reference voltage;*

*said TTL/CMOS compatible input buffer network further comprising means for switching between said TTL mode and said CMOS mode.*

*7. A TTL/CMOS compatible input buffer network as in claim 5 in which said reference voltage establishing circuit comprises:*

*a large transistor having one current carrying terminal connected to a supply voltage and a second current carrying terminal for providing said reference voltage; and*

*an operational amplifier which receives said selected voltage on one input terminal, said reference stage output voltage on another input terminal and which provides on an output terminal a control signal for controlling said large transistor.*

* * * * *

UNITED STATES PATENT AND TRADEMARK OFFICE

CERTIFICATE OF CORRECTION

PATENT NO. : RE 34,808

DATED : December 20, 1994

INVENTOR(S) : Hung-Cheng Hsieh

It is certified that error appears in the above-indentified patent and that said Letters Patent is hereby corrected as shown below:

Column 3, line 24, "$V_{REF}$on" should read —$V_{REF}$ on—.

Column 3, line 34, "of" should read —or—.

Column 5, line 6, "a" should read —an—.

Claim 5, column 6, line 60, "said reference voltage such that said reference stage" should read —said reference stage—.

Signed and Sealed this

Seventh Day of November, 1995

*Attest:*

*Attesting Officer*

BRUCE LEHMAN

*Commissioner of Patents and Trademarks*